(12) United States Patent
Lane et al.

(10) Patent No.: US 7,473,644 B2
(45) Date of Patent: Jan. 6, 2009

(54) METHOD FOR FORMING CONTROLLED GEOMETRY HARDMASKS INCLUDING SUBRESOLUTION ELEMENTS

(75) Inventors: Richard H. Lane, Boise, ID (US); Fred Fishburn, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 479 days.

(21) Appl. No.: 10/883,215

(22) Filed: Jul. 1, 2004

(65) Prior Publication Data

US 2006/0003182 A1    Jan. 5, 2006

(51) Int. Cl.
H01L 21/00 (2006.01)
H01L 21/44 (2006.01)

(52) U.S. Cl. ............... 438/688; 438/689; 257/E21.024; 257/E21.023

(58) Field of Classification Search .......... 257/E21.039, 257/E21.442, E21.209, E21.297, E21.316, 257/E21.206, E21.308, E21.024, E21.023; 438/689, 688
See application file for complete search history.

(56) References Cited

U.S. PATENT DOCUMENTS

| | | | |
|---|---|---|---|
| 3,736,534 A * | 5/1973 | Chaffee .................. 333/161 |
| 4,791,046 A | 12/1988 | Ogura | |
| 5,296,410 A | 3/1994 | Yang | |
| 5,618,383 A * | 4/1997 | Randall .................. 430/314 |
| 5,776,836 A | 7/1998 | Sandhu | |
| 5,916,821 A | 6/1999 | Kerber | |
| 6,110,837 A * | 8/2000 | Linliu et al. ............ 438/723 |
| 6,399,286 B1 * | 6/2002 | Liu et al. ................ 430/316 |
| 6,455,433 B1 | 9/2002 | Chang et al. | |
| 6,492,212 B1 * | 12/2002 | Ieong et al. ............. 438/157 |
| 6,514,849 B1 | 2/2003 | Hui et al. | |
| 6,537,866 B1 | 3/2003 | Shields et al. | |
| 6,610,607 B1 * | 8/2003 | Armbrust et al. ........ 438/717 |
| 6,617,098 B1 * | 9/2003 | Yu et al. ................. 430/323 |
| 6,664,173 B2 * | 12/2003 | Doyle et al. ............. 438/587 |
| 6,858,542 B2 * | 2/2005 | Sparks et al. ........... 438/701 |
| 6,867,116 B1 * | 3/2005 | Chung ................... 438/551 |
| 6,924,191 B2 * | 8/2005 | Liu et al. ................ 438/241 |
| 7,078,160 B2 * | 7/2006 | Brask et al. ............. 430/316 |
| 2002/0074309 A1 * | 6/2002 | Bjorkman et al. ......... 216/13 |
| 2002/0137344 A1 * | 9/2002 | Jordan et al. ............ 438/689 |
| 2003/0224559 A1 * | 12/2003 | Gross ..................... 438/128 |
| 2005/0087809 A1 * | 4/2005 | Dokumaci et al. ........ 257/365 |
| 2005/0127432 A1 * | 6/2005 | Yu et al. ................. 257/327 |
| 2005/0136663 A1 * | 6/2005 | Gan et al. ............... 438/689 |
| 2007/0037395 A1 * | 2/2007 | Beachy et al. ........... 438/689 |

FOREIGN PATENT DOCUMENTS

WO    WO 03/003447 A2    1/2003

* cited by examiner

*Primary Examiner*—Michael S Lebentritt
(74) *Attorney, Agent, or Firm*—TraskBritt

(57) ABSTRACT

Methods for forming accurate, symmetric cross-section spacers of hardmask material on a substrate such as a silicon wafer or quartz substrate, for formation of precise subresolution features useful for forming integrated circuits. The resulting symmetrical hardmask spacers with their symmetric upper portions may be used to accurately etch well-defined, high aspect ratio features in the underlying substrate. Some disclosed methods also enable simultaneous formation of hardmask structures of various dimensions, of both conventional and subresolution size, to enable etching structural features of different sizes in the underlying substrate.

46 Claims, 7 Drawing Sheets

METHOD FOR FORMING CONTROLLED GEOMETRY HARDMASKS INCLUDING SUBRESOLUTION ELEMENTS

BACKGROUND OF THE INVENTION

1. Field of the Invention

The present invention relates to the fabrication of integrated circuits. More specifically, the present invention relates to a method of producing fine geometry hardmasks with a controlled profile and height to enable the fabrication of precise subresolution features for integrated circuits and other structures.

2. State of the Art

In fabrication of semiconductor devices including integrated circuitry, such as memory dice, conventional photolithography limits the ability to produce very fine structural features. Currently, photolithography is only capable of producing structural features of about 100 nm in minimum dimension. This inadequacy limits the ability of a manufacturer to produce extremely small structural features for integrated circuits through conventional photolithography processes. A capability to further reduce the dimensions of structural feature size is particularly important to the fabrication of semiconductor memory devices to enable increasing the number of memory cells on such semiconductor memory devices of a given size.

U.S. Pat. No. 6,514,849 to Hui et al., U.S. Pat. No. 6,537,866 to Shields et al., U.S. Pat. No. 6,455,433 to Chang et al., U.S. Pat. No. 6,110,837 to Linliu et al., U.S. Pat. No. 5,916,821 to Kerber, U.S. Pat. No. 5,776,836 to Sandhu, and U.S. Pat. No. 5,296,410 to Yang attempt to overcome some of the problems associated with conventional photolithography.

An alternative to using conventional photolithography is a technique called "loose photo patterning." Generally described, loose photo patterning allows creating smaller mask features than would be possible with conventional photolithography. In loose photo patterning, mask features of conventional size are formed using conventional photolithography and dry etching, followed by coating such features with a layer of material. The layer of material is then removed from the top of the mask feature and the mask feature is subsequently etched away. The side coatings can be used as a hardmask to form so-called "subresolution" structural features, indicating that such structural features are of smaller dimensions than are achievable by using photolithography to form them directly. In other words, such features are smaller than the finest resolution photolithography processes can produce. Furthermore, all subresolution features will be the thickness of the coating used to coat the standard mask feature. Loose photo patterning allows creating mask features as small as 10 nm, which would not be possible with conventional photolithography.

A method of forming features using conventional loose photo patterning will be better understood with reference to FIGS. 1A-1D. FIG. 1A shows portion 100 of substrate 2, such as p or n type silicon or other semiconductor substrate material, including a first layer 4 deposited on substrate 2. First layer 4 is typically a silicon nitride layer approximately 900 Å in thickness. First layer 4 is formed into a selected geometry, as shown in FIG. 1A, using conventional photolithography and anisotropic etch processing. Referring to FIG. 1B, a hardmask layer 6 of, for example, 300 Å thick tetraethyloxysilicate (TEOS) silicon dioxide is deposited on first layer 4. As shown in FIG. 1C, hardmask layer 6 is anisotropically etched to leave only the portion of hardmask layer 6 covering the sidewalls of first layer 4. First layer 4 is then completely removed from substrate 2 by a dry or wet etch to form the sidewall spacer hardmask shown in FIG. 1D usable for further etching of substrate 2 to define selected structural feature patterns therein.

While conventional loose photo patterning allows for forming fine geometry hardmask features, it also results in a phenomenon known as "sputtering." As shown in FIG. 1D, sputtering occurs when hardmask layer 6 exhibits an asymmetric profile, which results in a poorly defined profile in the etched features of underlying substrate 2. These asymmetries of hardmask layer 6 produce different etch rates adjacent the inner and outer edges of hardmask layer 6 when the underlying substrate 2 is etched. As the aspect (height or depth to width) ratios of etched features in substrate 2 increase, the phenomenon of sputtering is aggravated and it becomes more important for the profile of hardmask layer 6 to be symmetric and, preferably, rectangular.

Therefore, due to the limits of conventional photolithography and loose photo patterning it is desirable to develop a method which results in hardmask elements with an accurately controlled profile and height, enabling the semiconductor device fabricator to achieve an accurately etched profile in a substrate underlying the hardmask.

BRIEF SUMMARY OF THE INVENTION

The present invention, in a number of embodiments, includes methods for forming accurate, symmetric cross-section hardmask elements on an underlying substrate to enable the fabrication by etching of precise structural features in the substrate and resulting end products incorporating such features. The resulting hardmask elements may be used to accurately etch well-defined, high aspect ratio features in the substrate free of sputtering defects.

In one exemplary embodiment, a method for forming hardmasks on a substrate is provided. First, a substrate is provided. Next, a first layer of a material may be formed on the substrate. Following formation of the first layer, a second layer may be formed on the exposed surface of the first layer. Next, a plurality of discrete structures may be formed on the substrate by masking, patterning and etching the first and second layers to a geometry defined by an exposed surface of the second layer and substantially vertical sidewalls extending upward from the substrate to the exposed surface. Following formation of the plurality of structures, a hardmask layer made may be deposited over the substrate and the plurality of discrete structures. Portions of the hardmask layer adhered to the exposed surface of the second layer may then be removed by an etching process, which also removes the portions of the hardmask layer on the substrate between the discrete structures, while the portions of the hardmask layer flanking the discrete structures remain as spacers, exhibiting an asymmetric profile. The discrete structures may then be planarized by an abrasive process such as chemical mechanical planarization (CMP) to remove the entire second layer and the laterally adjacent, uppermost, asymmetric ends of the remaining hardmask portion spacers. Following planarization, the first layer may be removed by a selective etching process, leaving only the remaining spacers formed as portions of the sidewalls of the original hardmask layer, providing well-defined, symmetrical hardmask elements for etching of the underlying substrate. The method of the above exemplary embodiment produces hardmask features having a well-defined, symmetric cross-section.

In another exemplary embodiment, a method for forming hardmask elements of various sizes on a substrate is disclosed. First, a substrate is provided. A first layer of a material may then be formed on the substrate. Following formation of the first layer, a second layer may be deposited on the exposed surface of the first layer. A plurality of discrete structures may then be formed by masking, patterning and etching the first and second layers to a geometry defined by an exposed surface of the second layer and substantially vertical sidewalls extending from the substrate to the exposed surface. Following formation of the plurality of structures, a hardmask layer may be deposited over the substrate and the plurality of discrete structures. The portion of the hardmask layer adhered to the exposed surface of the second layer may then be removed by an etching process, which also removes the portions of the hardmask layer between the discrete structures, while portions of the hardmask layer flanking the structures remain as spacers which exhibit an asymmetric profile. The discrete structures may then be planarized by an abrasive process such as CMP to remove the entire second layer and the laterally adjacent, uppermost ends of the remaining hardmask portion spacers. Following planarization, the exposed upper surface of the first layer of material of at least one of the structures may be protected and the unprotected portions of the first layer of the structures removed by an etching process. The method of the above exemplary embodiment produces hardmask features of various sizes having a well-defined, symmetric cross-section.

In yet another exemplary embodiment, a method for forming hardmasks of various sizes on a substrate is disclosed. A substrate is provided and a first layer of a material may be formed on the substrate. Following formation of the first layer, a second layer may be deposited on the exposed surface of the first layer. After formation of the second layer, a third layer of a material may be formed on the exposed surface of the second layer. A plurality of discrete structures may then be formed by masking, patterning and etching the first layer, the second layer, and the third layer to a geometry defined by an exposed surface of the third layer and substantially vertical sidewalls extending from the substrate to the exposed surface. After formation of the plurality of discrete structures, the exposed upper surface of at least one of the plurality of discrete structures may be protected. A hardmask layer may be deposited over the substrate and the plurality of discrete structures. Following deposition of the hardmask layer, the portions of the hardmask layer on the substrate and on the upper surfaces of the discrete structures may be removed by an etching process, the etching also removing the third layer and a portion of the second layer on any unprotected discrete structure. The plurality of discrete structures may be planarized to remove the second layer, the planarization stopping on the first layer of the unprotected discrete structures and the third layer of the at least one protected discrete structure. Finally, the exposed portions of the first layer may be removed by an etching process. The method of the above exemplary embodiment produces hardmask features of various sizes having a well-defined, symmetric cross-section.

These features, advantages, and alternative aspects of the present invention will be apparent to those skilled in the art from a consideration of the following detailed description taken in combination with the accompanying drawings.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

Figure 1A:
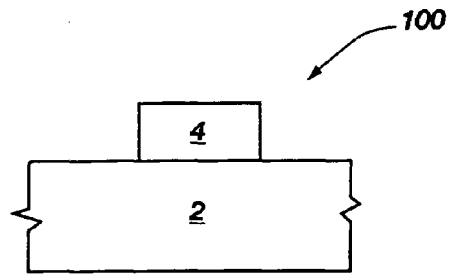
FIGS. 1A-1D are schematic sectional views illustrating a conventional loose photo patterning process.
Figure 1B:
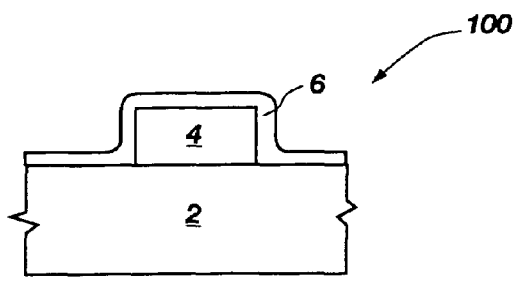
Figure 1C:
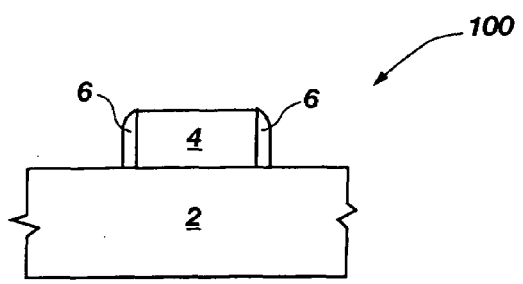
Figure 1D:
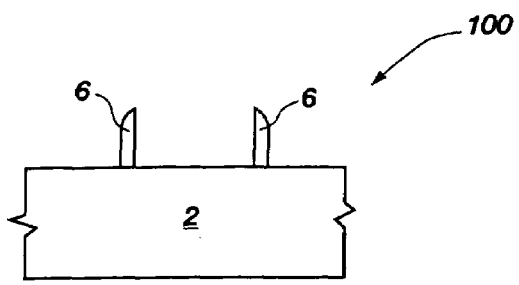

In the description which follows, like features and elements in the several embodiments are identified with the same or similar reference numerals for the convenience of the reader.

Figure 2A:
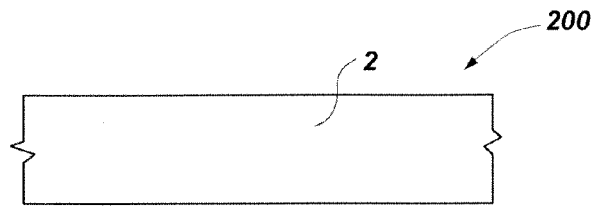
FIGS. 2A-2I are schematic sectional views illustrating an exemplary embodiment of a method of the present invention.
Figure 2B:

FIGS. 2A-2I illustrate an exemplary embodiment of a method of the present invention suitable for producing hardmask elements having an accurate, symmetric, rectangular cross-section. Referring to FIG. 2A, substrate 2 is provided made from a suitable semiconductor substrate such as silicon, polysilicon, or a layered semiconductor structure such as a silicon on insulator (SOI) structure, as exemplified by silicon on glass (SOG) and silicon on sapphire (SOS) structures. Substrate 2 may also be a glass material useful for forming reticles, such as soda-lime glass, borosilicate glass, or quartz. Then, as shown in FIG. 2B, a first layer 4 having upper surface 16 may be formed on and adhered to portion 200 of substrate 2 using techniques such as, for example, chemical vapor deposition (CVD), physical vapor deposition (PVD), or atomic layer deposition (ALD). First layer 4 may be formed from materials such as silicon nitride. In this exemplary embodiment, first layer 4 may be formed from 500 Å thick silicon nitride.

Figure 2C:
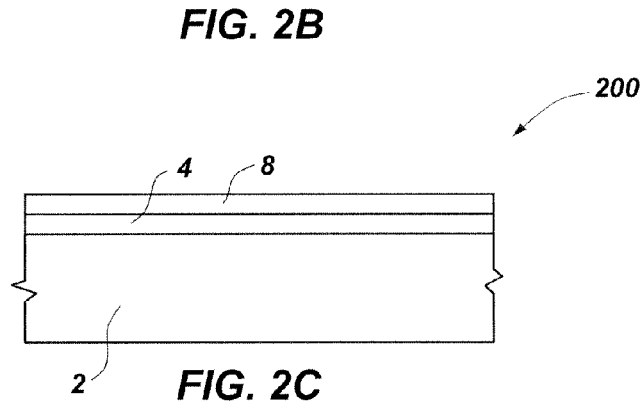

Referring to FIG. 2C, following deposition of first layer 4, second layer 8 may be deposited on top of and adhered to the upper surface 16 of first layer 4. Second layer 8 may be formed from TEOS-type silicon dioxide. Second layer 8 may be deposited using techniques such as, for example, CVD, PVD, or ALD. In this exemplary embodiment, second layer 8 may be formed from 500 Å thick TEOS-type silicon dioxide.

Figure 2D:
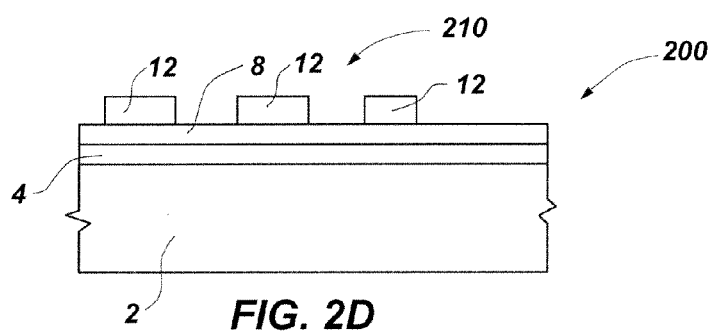
Figure 2E:
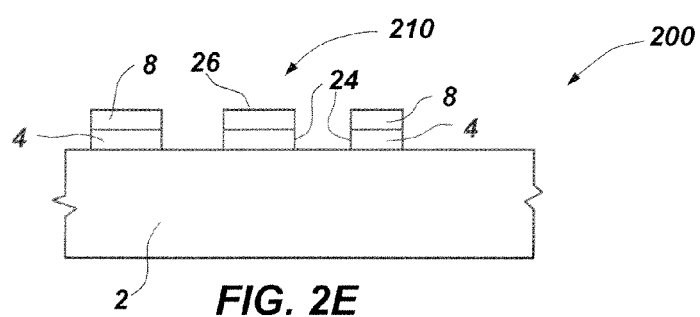

Referring to FIG. 2D, following deposition of second layer 8, portion 200 may be covered with a patterned and developed photoresist 12, etched, and discrete structures in the form of regions 210 formed from etched first and second layers 4, 8 using conventional photolithography techniques. Referring to FIG. 2E, regions 210 are shown after etching and subsequent removal of photoresist 12. As shown in FIG. 2E, regions 210 formed of the remaining segments of first layer 4 and second layer 8 may exhibit a geometry defined by substantially vertical sidewalls 24 extending from substrate 2 to exposed upper surface 26 of second layer 8.

Figure 2F:
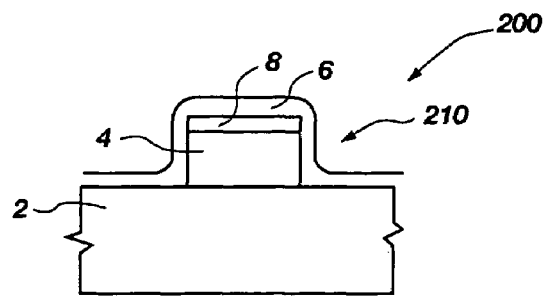

Referring to FIG. 2F, following forming of regions 210, hardmask layer 6 may be formed over regions 210 and exposed portions of substrate 2 between regions 210. Hardmask layer 6 adheres to regions 210 and intervening portions of substrate 2. Hardmask layer 6 may be formed from materials such as TEOS-type silicon dioxide, silicon nitride, polysilicon, titanium nitride, aluminum oxide ($Al_2O_3$), amorphous carbon, or other suitable material, depending on the material of substrate 2, first layer 4, second layer 8, and the intended etch chemistry to be used with hardmask layer 6. In an exemplary embodiment, hardmask layer 6 may be formed from 300 Å thick TEOS-type silicon dioxide. Hardmask layer 6 may be deposited by a process useful for precisely defining a thickness thereof such as, for example, low pressure chemical vapor deposition (LPCVD) or atomic layer deposition (ALD).

Figure 2G:
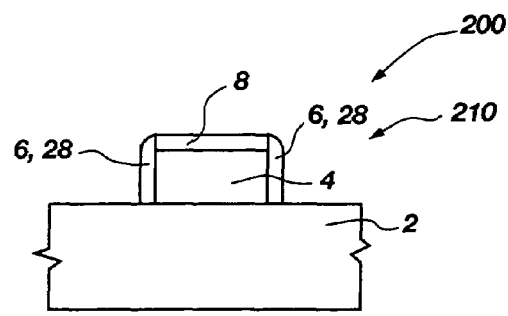

Referring to FIG. 2G, following deposition of hardmask layer 6, hardmask layer 6 and second layer 8 may be anisotropically etched to leave only portions of hardmask layer 6 covering the sides of regions 210 comprised of the remaining portions of first layer 4 and second layer 8 to form spacers 28. In other words, the portion of hardmask layer 6 adhered to the upper surface 26 of second layer 8 may be removed by etching, which also removes the portions of hardmask layer 6 on substrate 2 between regions 210. Second layer 8 may not be completely etched through as is shown in FIG. 2G, leaving a sufficient thickness of second layer 8 remaining to allow spacer 28 to be of stable (constant) thickness at a height at least coincident with the top of first layer 4.

Figure 2H:
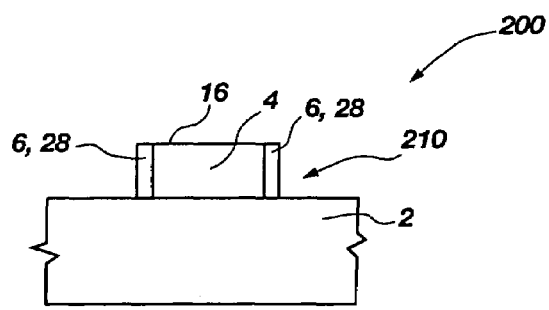

Referring to FIG. 2H, following etching of hardmask layer 6, upper portions of spacers 28 formed from hardmask layer 6 and all of second layer 8 may be removed by an abrasive planarization process such as CMP. A CMP compound may be selected for the polishing slurry that will not remove first layer 4, instead stopping on upper surface 16 thereof. In an exemplary embodiment, spacers 28 may be about 2000 Å in height. The remaining spacers 28 formed of hardmask layer 6 exhibit a symmetric, rectangular cross-section.

Figure 2I:
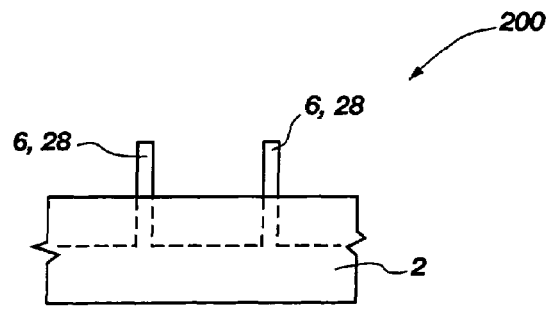

Referring to FIG. 2I, first layer 4 may then be removed using a selective dry or wet etching process, leaving only the spacers 28 formed of hardmask layer 6 on substrate 2 as hardmask elements. Subsequently, substrate 2 may be etched to form wells (shown by the dashed lines) or apertures having a controlled and accurate profile free from sputtering defects using the hardmask elements comprising spacers 28 formed of hardmask layer 6 as an etch mask. Due to the symmetrical cross-section of spacers 28 and the rectangular, squared-off upper portion of the cross-section, the etch rate on each side of spacers 28 is substantially the same, eliminating asymmetry in the pattern etched into substrate 2. Etched features in substrate 2 using hardmasks of the present invention may have aspect ratios of up to 5:1 or more.

Figure 3A:
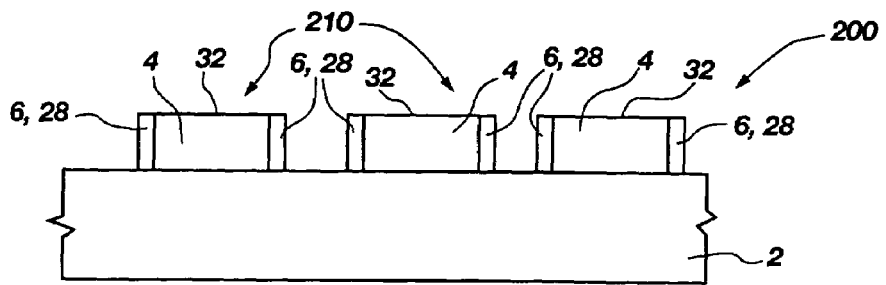
FIGS. 3A-3D are schematic sectional views illustrating another exemplary embodiment of a method of the present invention.
Figure 3B:
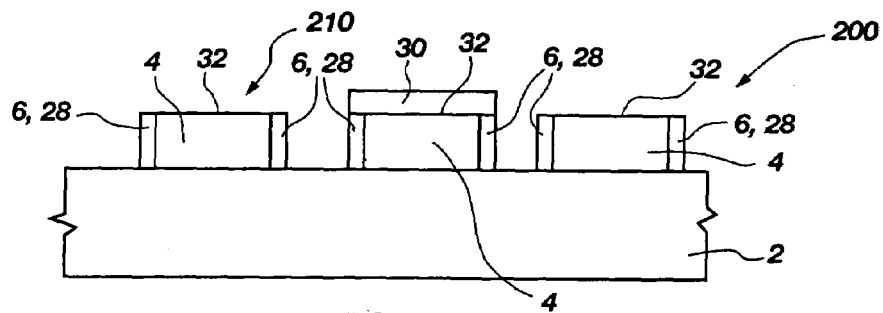

In another exemplary embodiment of a method of the present invention, hardmask spacers of a symmetric geometry may be formed to various widths according to the design of the desired structural features to be etched in substrate 2. Referring to FIG. 3A, a plurality of discrete structures in the form of regions 210 may be formed on substrate 2. Regions 210 shown in FIG. 3A include first layer 4 as previously described, bounded by spacers 28 made from hardmask layer 6. Regions 210 shown in FIG. 3A may be formed as in the previous exemplary embodiment as shown and described with respect to FIGS. 2A-2H. Referring to FIG. 3B, a photoresist 30 may be applied to upper surface 32 of first layer 4 and selectively patterned and developed using conventional photolithography techniques to cover upper surfaces 32 of at least one region 210.

Figure 3C:
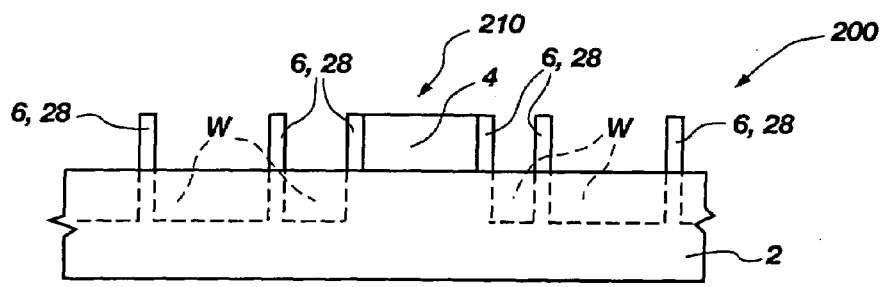
Figure 3D:
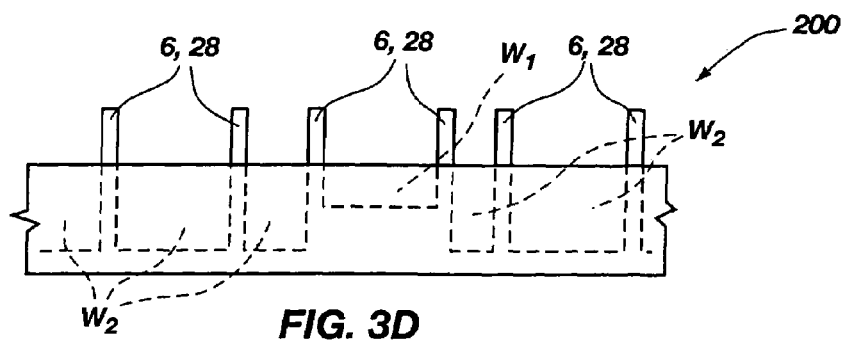

Referring to FIG. 3C, following application of photoresist 30, first layer 4 may be removed from regions 210 that are not protected with photoresist 30 using an appropriate selective dry or wet etching process. Next, photoresist 30 may then be removed using conventional techniques. Thus, subresolution hardmask elements are formed of spacers 28 where first layer 4 has been removed, while larger, conventionally dimensioned hardmask elements are formed from the regions 210 where first layer 4 remains flanked by spacers 28, the larger hardmask elements being of only slightly larger dimension than that of each region 210 prior to deposition of hardmask layer 6. By intentionally undersizing a given region 210 intended to form a larger hardmask element to allow for the added width provided by spacers 28, the dimensions of larger hardmask elements may be precisely controlled. Subsequently, substrate 2 may be etched to form wells or apertures W of various widths (shown by the broken lines) and having a controlled and accurate profile due to the symmetric profile of the spacers 28 formed of hardmask layer 6. Thus, both conventionally dimensioned features as well as subresolution-sized features may be formed. Alternatively, by using an etchant suitable for removal of the material of layer 4 as well as substrate 2, wells or apertures $W_1$ and $W_2$ of different depths may be formed, as depicted in FIG. 3D. As in the previous exemplary embodiment, due to the precise, squared-off cross-section of spacers 28, the etch rate on each side of spacers 28 as well as of regions 210 having flanking spacers 28 is substantially the same. Etched features in substrate 2 using hardmasks of the present invention may have aspect ratios of up to 5:1 or greater.

Figure 4A:
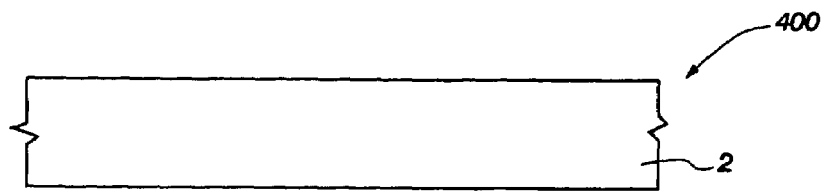
FIGS. 4A-4K are schematic sectional views illustrating yet another exemplary embodiment of a method of the present invention.
Figure 4B:
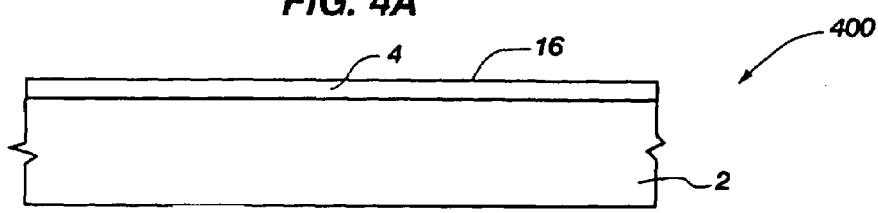

FIGS. 4A-4K illustrate yet another exemplary embodiment of a method of the present invention suitable for producing hardmask spacers of various widths yet having an accurate, symmetric, rectangular geometry. Referring to FIG. 4A, substrate 2 is provided of a suitable semiconductor substrate such as silicon, polysilicon, or a layered semiconductor structure such as a silicon on insulator (SOI) structure, as exemplified by silicon on glass (SOG) and silicon on sapphire (SOS) structures. Substrate 2 may also be a glass useful for forming reticles such as soda-lime glass, borosilicate glass, or quartz. Then, as shown in FIG. 4B, a first layer 4 having upper surface 16 may be formed on and adhered to portion 400 of substrate 2 using techniques such as CVD, PVD, or ALD. First layer 4 may be formed from materials such as silicon nitride or other suitable material as noted above. In an exemplary embodiment, first layer 4 may be formed from 500 Å thick silicon nitride.

Figure 4C:
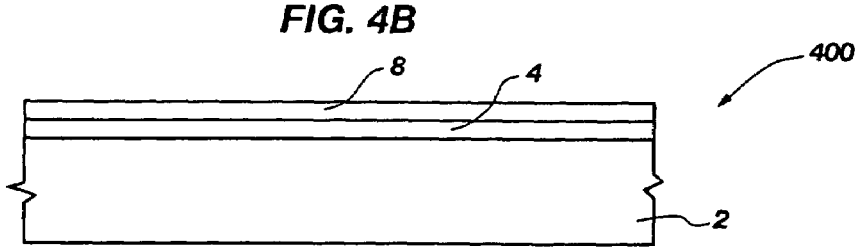
Figure 4D:
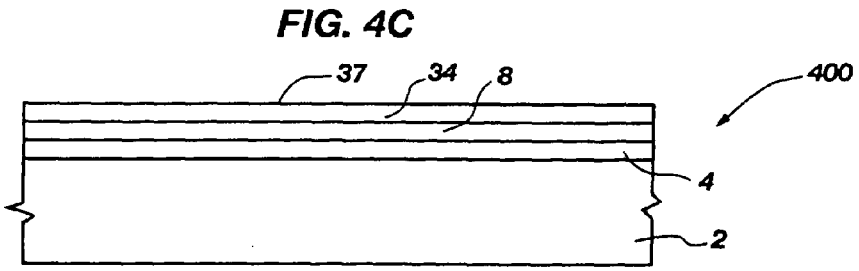

Referring to FIG. 4C, following formation of first layer 4, second layer 8 may be deposited on top of and adhered to the upper surface 16 of first layer 4. Second layer 8 may be formed from TEOS-type silicon dioxide or other suitable material as noted above. Second layer 8 may be deposited using techniques such as CVD, PVD, or ALD. In an exemplary embodiment, second layer 8 may be formed from 500 Å thick TEOS-type silicon dioxide. Next, referring to FIG. 4D, third layer 34 having upper surface 37 may be formed from aluminum oxide ($Al_2O_3$). In an exemplary embodiment, third layer 34 may be formed from 100 Å thick $Al_2O_3$.

Figure 4E:
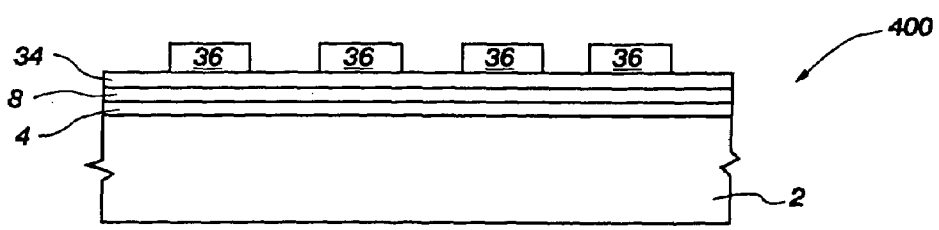
Figure 4F:
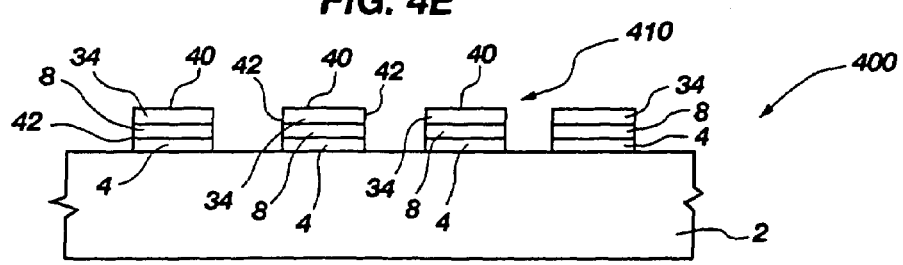

Referring to FIG. 4E, following deposition of third layer 34, portion 400 may be covered by a patterned and developed photoresist 36 and anisotropically etched using conventional techniques known to those of ordinary skill in the art to form discrete structures in the form of regions 410. Referring to FIG. 4F, regions 410 are shown after etching and removal of photoresist 36. As shown in FIG. 4F, regions 410 may exhibit a geometry defined by substantially vertical sidewalls 42 extending from substrate 2 to upper surfaces 40.

Figure 4G:
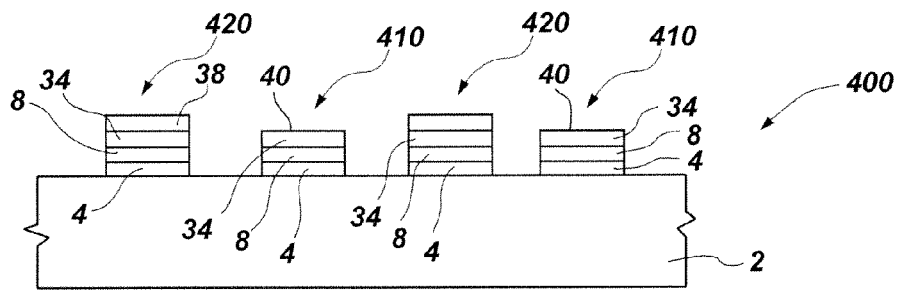

Referring to FIG. 4G, following formation of regions 410, photoresist 38 may be selectively patterned over the upper surface 40 of one or more regions 410. The regions 410 covered and protected by photoresist 38 will be referred to as regions 420.

Figure 4H:
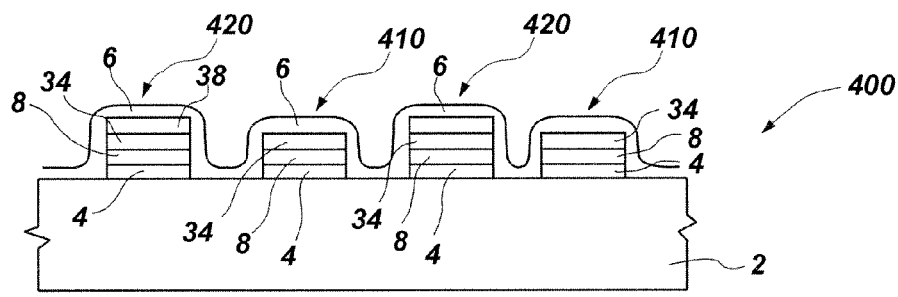

Referring to FIG. 4H, hardmask layer 6 may be formed over substrate 2, regions 410 formed of first layer 4, second layer 8, third layer 34 and, where photoresist 38 is present, regions 420. Hardmask layer 6 covers portions of substrate 2 between regions 410 and 420. Hardmask layer 6 adheres to first layer 4, second layer 8, third layer 34, photoresist 38 and intervening portions of substrate 2. Hardmask layer 6 may be formed from materials such as TEOS-type silicon dioxide, silicon nitride, polysilicon, titanium nitride, amorphous carbon, or aluminum oxide ($Al_2O_3$) depending on the material of substrate 2, first layer 4, second layer 8, third layer 34, and the intended etch chemistry to be used with hardmask layer 6. In an exemplary embodiment, hardmask layer 6 may be formed from 300 Å thick TEOS-type silicon dioxide. Hardmask layer 6 may be deposited by a process such as low pressure chemical vapor deposition (LPCVD) or atomic layer deposition (ALD).

Figure 4I:
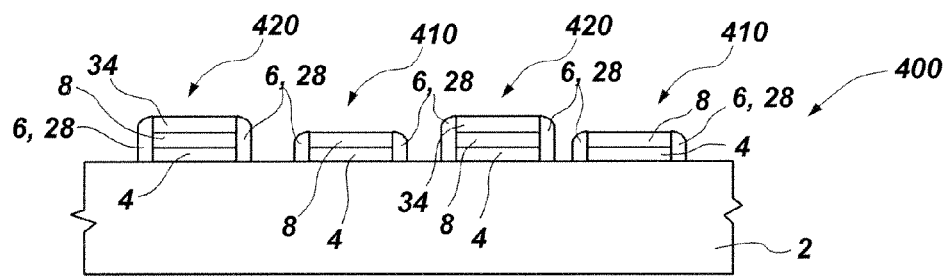

Referring to FIG. 4I, following deposition of hardmask layer 6, hardmask layer 6, third layer 34 and a portion of second layer 8 may be anisotropically etched in regions 410 where photoresist 38 is not present, leaving only portions of hardmask layer 6 forming spacers 28 covering the sides of first layer 4 and second layer 8. In the regions 410 where second layer 8 is etched, it is not completely etched. Instead, a sufficient thickness of second layer 8 remains after this etching step to ensure spacers 28 are at a stable (constant) thickness at least to a level coincident with the top of first layer 4. Furthermore, in the regions 420 where third layer 34 is protected by photoresist 38, it is not completely removed.

Instead, the remaining portion of third layer 34 may be typically about 80 Å thick following etching.

Figure 4J:
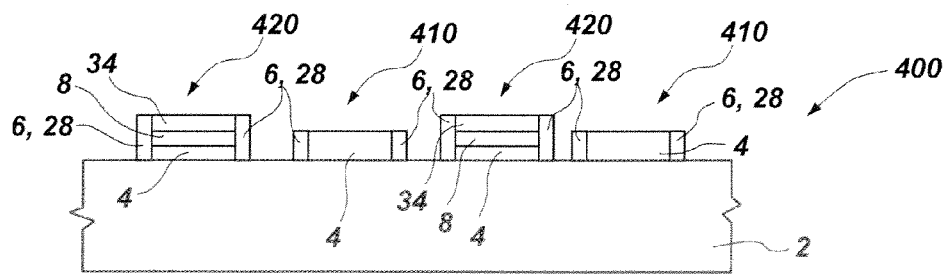

Referring to FIG. 4J, following etching of hardmask layer 6, regions 410 and regions 420 may be planarized using an abrasive process such as CMP. While regions 420 are slightly higher than regions 410, the CMP process is capable of simultaneously planarizing both regions due to the CMP pad being formed of a yieldable or deformable material. A CMP compound for a slurry may be selected that will stop on first layer 4 in regions 410 and stop on the remaining thickness of third layer 34 in regions 420. The remaining sidewall portions of hardmask layer 6 forming spacers 28 exhibit a symmetric, rectangular profile.

Figure 4K:
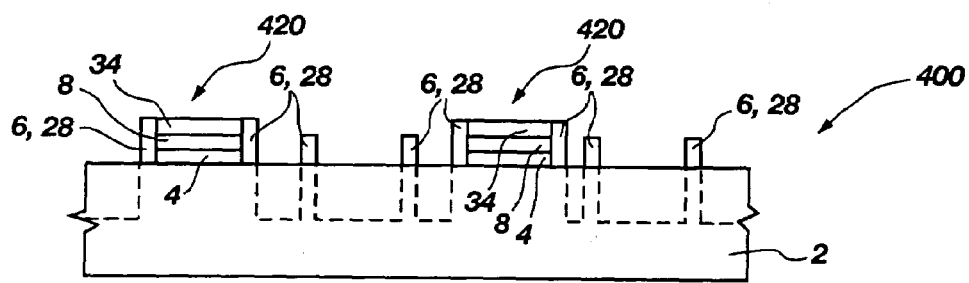

Referring to FIG. 4K, after CMP, first layer 4 may be removed from regions 410 using a selective dry or wet etching process, leaving only the spacers 28 formed of hardmask layer 6 on substrate 2 as subresolution hardmask elements. The material of the remaining portion of third layer 34 is resistant to the etchant used to remove first layer 4. Therefore, third layer 34 protects underlying first layer 4 and second layer 8 in regions 420 from being removed, leaving a much larger hardmask element extending between spacers 28 bridged by the material of third layer 34. Subsequently, substrate 2 may be etched to form wells or apertures (shown by the dashed lines) having a controlled and accurate profile due to the symmetric profile of spacers 28 formed of hardmask layer 6. The etch rate of the material of substrate 2 on each side of spacers 28 is substantially the same. Etched structural features in substrate 2 using hardmask elements of the present invention may have aspect ratios of up to 5:1 or greater. In regions 420 where third layer 34 remains, bridging spacers 28 formed on the sides of third layer 34, second layer 8 and first layer 4, hardmask features have a slightly greater dimension than the original photopatterned and etched regions 410 prior to formation of hardmask layer 6 thereover, which dimension may be compensated for by slightly undersizing regions 410 to be used as regions 420. As a result, the present invention may be used to facilitate simultaneous formation of both conventionally dimensioned and subresolution-dimensioned features in substrate 2.

Although the foregoing description contains many specifics, these are not to be construed as limiting the scope of the present invention, but merely as providing certain exemplary embodiments. Similarly, other embodiments of the invention may be devised which do not depart from the spirit or scope of the present invention. The scope of the invention is, therefore, indicated and limited only by the appended claims and their legal equivalents, rather than by the foregoing description. All additions, deletions, and modifications to the invention, as disclosed herein, which fall within the meaning and scope of the claims are encompassed by the present invention.

What is claimed is:

1. A method for forming hardmask elements on a substrate comprising:
    forming a first material layer on a substrate;
    forming a second material layer on the first material layer;
    forming a plurality of laterally-spaced, discrete structures comprising the first and second material layers on the substrate and leaving intervening portions of the substrate exposed, the plurality of laterally-spaced, discrete structures each having a geometry defined by a top surface and substantially vertical sidewalls;
    depositing a hardmask material layer over the top surfaces and sidewalls of the plurality of laterally-spaced, discrete structures and the intervening, exposed portions of the substrate;
    removing portions of the hardmask material layer over the top surfaces of the laterally-spaced, discrete structures and the intervening portions of the substrate while leaving spacers of the hardmask material layer on the sidewalls of the laterally-spaced, discrete structures;
    planarizing the plurality of laterally-spaced, discrete structures to remove all of the second material layer and adjacent portions of the spacers; and
    removing the first material layer to form a plurality of hardmask elements.

2. The method of claim 1, further comprising defining at least one well within or at least one aperture through the substrate by etching using the hardmask elements to define boundaries thereof.

3. The method of claim 1, wherein the planarizing is effected by abrasive planarization.

4. The method of claim 3, wherein the abrasive planarization comprises chemical mechanical planarization.

5. The method of claim 1, further comprising selecting the substrate from a material comprising a layer of semiconductor material and a layer of glass material.

6. The method of claim 1, further comprising forming the first material layer from silicon nitride.

7. The method of claim 1, further comprising forming the first material layer to a thickness of about 500 Å.

8. The method of claim 1, further comprising forming the second material layer from silicon dioxide.

9. The method of claim 1, further comprising forming the second material layer to a thickness of about 500 Å.

10. The method of claim 1, further comprising forming the hardmask material layer from a material selected from the group consisting of silicon dioxide, silicon nitride, polysilicon. titanium nitride, amorphous carbon, and aluminum oxide.

11. The method of claim 1, further comprising forming the hardmask material layer to a thickness of about 300 Å.

12. The method of claim 1, further comprising planarizing the spacers to a height of about 2000 Å.

13. The method of claim 1, wherein forming the plurality of laterally-spaced, discrete structures is effected by selectively masking portions of the second material layer and etching.

14. The method of claim 1, wherein removing the portions of the hardmask material layer is effected by etching.

15. A method for forming hardmask elements of different sizes on a substrate comprising:
    forming a first material layer on a substrate;
    forming a second material layer on the first material layer;
    forming a plurality of laterally-spaced, discrete structures comprising the first and second material layers on the substrate and leaving intervening portions of the substrate exposed, the plurality of laterally-spaced, discrete structures each having a geometry defined by a top surface and substantially vertical sidewalls;
    depositing a hardmask material layer over the top surfaces and sidewalls of the plurality of laterally-spaced, discrete structures and the intervening, exposed portions of the substrate;
    removing portions of the hardmask material layer over the top surfaces of the laterally-spaced, discrete structures and the intervening portions of the substrate while leaving spacers of the hardmask material layer on the sidewalls of the laterally-spaced, discrete structures;
    planarizing the plurality of laterally-spaced, discrete structures to remove all of the second material layer and adjacent portions of the spacers;
    protecting the top surface of at least one of the plurality of laterally-spaced, discrete structures; and
    removing the first material layer of any unprotected laterally-spaced, discrete structure to form a plurality of hardmask elements having a first lateral dimension and at least one hardmask element having a second, larger dimension.

16. The method of claim 15, further comprising defining at least one well within or at least one aperture through the substrate by etching using the hardmask elements to define boundaries thereof.

17. The method of claim 15, wherein the planarizing is effected by abrasive planarization.

18. The method of claim 17, wherein the abrasive planarization comprises chemical mechanical planarization.

19. The method of claim 15, further comprising selecting the substrate from a material comprising a layer of semiconductor material and a layer of glass material.

20. The method of claim 15, further comprising forming the first material layer from silicon nitride.

21. The method of claim 15, further comprising forming the first material layer to a thickness of about 500 Å.

22. The method of claim 15, further comprising forming the second material layer from silicon dioxide.

23. The method of claim 15, further comprising forming the second material layer to a thickness of about 500 Å.

24. The method of claim 15, further comprising forming the hardmask material layer from a material selected from the group consisting of silicon dioxide, silicon nitride, polysilicon, titanium nitride, amorphous carbon, and aluminum oxide.

25. The method of claim 15, further comprising forming the hardmask material layer to a thickness of about 300 Å.

26. The method of claim 15, further comprising planarizing the spacers to a height of about 2000 Å.

27. The method of claim 15, wherein forming the plurality of laterally-spaced, discrete structures is effected by selectively masking portions of the second material layer followed by etching.

28. The method of claim 15, wherein removing the portions of the hardmask material layer is effected by etching.

29. The method of claim 15, further comprising protecting the top surface of the at least one of the plurality of laterally-spaced, discrete structures by applying a resist thereto.

30. A method for forming hardmasks of different sizes on a substrate comprising:
forming a first material layer on a substrate;
forming a second material layer on the first material layer;
forming a third material layer on the second material layer;
forming a plurality of discrete structures comprising the first, second and third material layers on the substrate, the plurality of discrete structures each having a geometry defined by a top surface and substantially vertical sidewalls;
protecting the top surface of at least one of the discrete structures;
depositing a hardmask material layer over the top surfaces and sidewalls of the plurality of discrete structures and intervening portions of the substrate;
removing portions of the hardmask material layer over the top surfaces of the discrete structures and intervening portions of the substrate and removing the third material layer and a portion of the second material layer of any discrete structure having an unprotected top surface while leaving spacers of the hardmask material layer on the sidewalls of the discrete structures;
planarizing the plurality of discrete structures to remove all of the second material layer and adjacent portions of the spacers of any discrete structure having an unprotected top surface; and
removing the first material layer of any discrete structure having an unprotected top surface to form a plurality of hardmask elements having a first lateral dimension and at least one hardmask element having a second larger lateral dimension.

31. The method of claim 30, further comprising defining at least one well within or at least one aperture through the substrate by etching using the hardmask elements to define boundaries thereof.

32. The method of claim 30, wherein the planarizing is effected by abrasive planarization.

33. The method of claim 32, wherein the abrasive planarization comprises chemical mechanical planarization.

34. The method of claim 30, further comprising selecting the substrate from a material comprising a layer of semiconductor material and a layer of glass material.

35. The method of claim 30, further comprising forming the first material layer from silicon nitride.

36. The method of claim 30, further comprising forming the first material layer to a thickness of about 500 Å.

37. The method of claim 30, further comprising forming the second material layer from silicon dioxide.

38. The method of claim 30, further comprising forming the second material layer to a thickness of about 500 Å.

39. The method of claim 30, further comprising forming the hardmask material layer from a material selected from the group consisting of silicon dioxide, silicon nitride, polysilicon, titanium nitride, amorphous carbon, and aluminum oxide.

40. The method of claim 30, further comprising forming the hardmask material layer to a thickness of about 300 Å.

41. The method of claim 30, further comprising planarizing the spacers of any unprotected discrete structure to a height of about 2000 Å.

42. The method of claim 30, wherein forming the plurality of discrete structures is effected by selectively masking portions of the third material layer and etching.

43. The method of claim 30, wherein removing portions of the hardmask material layer over the top surfaces of the discrete structures and intervening portions of the substrate and removing the third material layer and a portion of the second material layer of any discrete structure having an unprotected top surface is effected by etching.

44. The method of claim 30, further comprising protecting the top surface of the at least one of the plurality of discrete structures by applying a resist thereto.

45. The method of claim 30, further comprising forming the third material layer to a thickness of about 100 Å.

46. The method of claim 30, further comprising forming the third material layer from aluminum oxide.

* * * * *

UNITED STATES PATENT AND TRADEMARK OFFICE
CERTIFICATE OF CORRECTION

PATENT NO. : 7,473,644 B2 Page 1 of 1
APPLICATION NO. : 10/883215
DATED : January 6, 2009
INVENTOR(S) : Lane et al.

It is certified that error appears in the above-identified patent and that said Letters Patent is hereby corrected as shown below:

In column 8, line 11, in Claim 2, after "thereof" insert -- . --.

In column 8, lines 29-30, in Claim 10, delete "polysilicon." and insert -- polysilicon, --, therefor.

In column 10, line 11, in Claim 30, delete "second" and insert -- second, --, therefor.

Signed and Sealed this

Fifth Day of May, 2009

JOHN DOLL
*Acting Director of the United States Patent and Trademark Office*